(12) United States Patent
Suh et al.

(10) Patent No.: US 8,778,600 B2
(45) Date of Patent: Jul. 15, 2014

(54) METHOD OF MANUFACTURING HIGH RESOLUTION ORGANIC THIN FILM PATTERN

(75) Inventors: Min-Chul Suh, Yongin (KR); Sin-Doo Lee, Seoul (KR); Won-Suk Choi, Seoul (KR); Min-Hoi Kim, Yongin-Si (KR)

(73) Assignees: Samsung Display Co., Ltd., Yongin, Gyeonggi-Do (KR); SNU R&DB Foundation, Seoul (KR)

( * ) Notice: Subject to any disclaimer, the term of this patent is extended or adjusted under 35 U.S.C. 154(b) by 89 days.

(21) Appl. No.: 12/979,260

(22) Filed: Dec. 27, 2010

(65) Prior Publication Data

US 2011/0171584 A1   Jul. 14, 2011

(30) Foreign Application Priority Data

Jan. 11, 2010   (KR) ........................ 10-2010-0002377

(51) Int. Cl.
*G03F 7/26*   (2006.01)

(52) U.S. Cl.
USPC ............................ 430/322; 430/331; 430/329

(58) Field of Classification Search
USPC .................................. 430/322, 329, 315, 331
See application file for complete search history.

(56) References Cited

U.S. PATENT DOCUMENTS

| | | | |
|---|---|---|---|
| 5,386,430 A * | 1/1995 | Yamagishi et al. | 372/57 |
| 2001/0033998 A1 * | 10/2001 | Fujio | 430/322 |
| 2004/0188672 A1 * | 9/2004 | Spreitzer et al. | 257/40 |
| 2004/0224866 A1 * | 11/2004 | Matsunaga et al. | 510/175 |
| 2005/0196969 A1 | 9/2005 | Gunner et al. | |
| 2006/0240338 A1 | 10/2006 | Satoh et al. | |
| 2007/0023837 A1 | 2/2007 | Lee et al. | |
| 2007/0035243 A1 | 2/2007 | Lee | |
| 2008/0176398 A1 | 7/2008 | Jain et al. | |
| 2008/0292976 A1 * | 11/2008 | Terasaki et al. | 430/5 |
| 2009/0011199 A1 | 1/2009 | Isono et al. | |
| 2011/0076464 A1 | 3/2011 | Elschner et al. | |
| 2011/0159252 A1 | 6/2011 | Ober et al. | |

FOREIGN PATENT DOCUMENTS

| | | |
|---|---|---|
| JP | 07-078820 | 3/1995 |
| JP | 2002-170669 A | 6/2002 |
| JP | 2007-53090 A | 3/2007 |
| JP | 2008-085200 A | 4/2008 |
| JP | 2008-243817 A | 10/2008 |

(Continued)

OTHER PUBLICATIONS

English Machine Translation: Yong-Uk, KR 1020050077525, Aug. 3, 2005.*
Official Action issued by the Korean Industrial Property Office dated Apr. 28, 2011 in Korean Patent Application No. 10-2010-0008016.

(Continued)

*Primary Examiner* — Caleen Sullivan
(74) *Attorney, Agent, or Firm* — Knobbe, Martens, Olson & Bear, LLP

(57) ABSTRACT

A method of forming a high resolution organic thin film pattern, the method including forming a first organic layer on a substrate; selectively removing the first organic layer by selectively irradiating light energy onto the first organic layer, and forming a remaining part of the first organic layer as a sacrifice layer; forming a second organic layer on the substrate and the entire surface of the sacrifice layer; and lifting off the second organic layer formed on the sacrifice layer by removing the sacrifice layer using a solvent, and forming the remaining second organic layer as a second organic layer pattern.

20 Claims, 7 Drawing Sheets

(56) References Cited

FOREIGN PATENT DOCUMENTS

| | | |
|---|---|---|
| JP | 2009-29802 A | 2/2009 |
| KR | 1020050077525 A | 8/2005 |
| KR | 10-2006-0067050 A | 6/2006 |
| KR | 10-2007-0013888 A | 1/2007 |
| TW | 200710584 A | 3/2007 |
| WO | WO 2005/045911 A1 | 5/2005 |
| WO | 2008/038588 A1 | 4/2008 |
| WO | WO 2009/068415 A1 | 6/2009 |
| WO | WO 2009/143357 A2 | 11/2009 |

OTHER PUBLICATIONS

Office Action issued by the Chinese Patent Office dated Nov. 5, 2012 in the examination of the correspondence Chinese Patent Application No. 201110006544.5, 8 pages.

Office Action issued by the Japanese Patent Office dated Jan. 29, 2013 in the examination of corresponding Japanese Patent Application No. 2010-249571, 5 pages.

Extended European Search Report dated Mar. 3, 2014, issued in connection with corresponding European Patent Application No. 11250012.9.

\* cited by examiner

METHOD OF MANUFACTURING HIGH RESOLUTION ORGANIC THIN FILM PATTERN

CROSS-REFERENCE TO RELATED APPLICATIONS

This application claims the benefit of Korean Patent Application No. 10-2010-0002377, filed on Jan. 11, 2010, in the Korean Intellectual Property Office, the disclosure of which is incorporated herein in its entirety by reference.

BACKGROUND

1. Field

The present embodiments relate to a method of manufacturing an organic thin film pattern, and more particularly, to a method of manufacturing a high resolution organic thin film pattern capable of realizing a simple manufacturing process, stability, and low cost.

2. Description of the Related Technology

Organic substances are easily combined with other substances and are easily processed so as to exhibit desired electrical optical characteristics and thus they are spotlighted as materials favorable for high performance and low cost next generation electronic devices.

Although low-molecular organic materials have been used to manufacture organic light emitting display devices or organic thin film transistors using a vacuum deposition method, it is not easy to manufacture high resolution devices due to a vacuum process and limited resolution of a shadow mask. The present embodiments overcome the above problems as well as provide additional advantages.

SUMMARY OF CERTAIN INVENTIVE ASPECTS

The present embodiments provide a method of manufacturing a high resolution organic thin film pattern capable of realizing a simple manufacturing process, stability, and low cost.

According to an aspect of the present embodiments, there is provided a method of forming an organic thin film pattern, the method including: forming a first organic layer on a substrate; selectively removing the first organic layer by selectively irradiating light energy onto the first organic layer, and forming a remaining part of the first organic layer as a sacrifice layer; forming a second organic layer on the substrate and the entire surface of the sacrifice layer; and lifting off the second organic layer formed on the sacrifice layer by removing the sacrifice layer using a solvent, and forming the remaining second organic layer as a second organic layer pattern.

In the forming of the first organic layer, the first organic layer may include a fluorine-based polymer.

In the selective removing of the first organic layer, a laser ablation method may be used to irradiate a laser on a mask having a predetermined pattern disposed on the first organic layer.

In the selective removing of the first organic layer, an excimer laser may be irradiated.

In the forming of the second organic layer, the second organic layer may comprise an organic light emitting material of an organic light emitting device (OLED) containing an organic light emitting material disposed on the substrate between a first electrode and a second electrode.

A plurality of layers of the organic light emitting material of different colors may be formed so as to emit a white light.

In the forming of the second organic layer, the organic layer may be an active layer of an organic thin film transistor.

In the forming of the second organic layer, the second organic layer may comprise an organic color filter material.

In the forming of the second organic layer, the second organic layer may be formed using a deposition method.

In the lifting off of the second organic layer, the solvent may be a fluorine-based solvent.

According to another aspect of the present embodiments, there is provided a method of forming an organic thin film pattern, the method including: (a) forming a first organic layer on a substrate; (b) selectively removing the first organic layer by selectively irradiating light energy onto the first organic layer, and forming a sacrifice layer from a remaining part of the first organic layer; (c) forming a second organic layer on the substrate and the entire surface of the sacrifice layer; (d) lifting off second part of the organic layer formed on the sacrifice layer by removing the sacrifice layer using a solvent, and forming a second organic layer pattern from the remaining second organic layer; and (e) continuously performing a unit process of (a) through (d) on the substrate on which the second organic layer pattern is formed, and forming another second organic layer pattern on a region of the substrate on which the second organic layer pattern is not formed.

In the forming of the first organic layer, the first organic layer may include a fluorine-based polymer.

In the selectively removing of the first organic layer, a laser ablation method is used to irradiate laser on a mask having a predetermined pattern disposed on the first organic layer.

In the selective removing of the first organic layer, an excimer laser may be irradiated.

In the forming of the second organic layer, the second organic layer may comprise an organic light emitting material of an OLED containing an organic light emitting material disposed on the substrate between a first electrode and a second electrode.

The organic light emitting material may comprise a low-molecular material.

In some embodiments, the organic light emitting material formed during the forming of the second organic layer has a different color from the organic light emitting material formed during continuous performing of the unit process.

The organic light emitting material formed during the forming of the second organic layer and the organic light emitting material formed during continuous performing of the unit process may realize full colors.

In the forming of the second organic layer, the second organic layer may comprise a color filter material.

The color filter material formed during the forming of the second organic layer may have a different color from the color filter materials formed during continuous performing of the unit process.

The color filter material formed during the forming of the second organic layer and the color filter material formed during continuous performing of the unit process may realize full colors.

In the forming of the second organic layer, the second organic layer may be formed using a deposition method.

In the lifting off of the second organic layer, the solvent may be a fluorine-based solvent. Also, step (e) above may be repeatedly performed a predetermined number of times.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF CERTAIN INVENTIVE EMBODIMENTS

Hereinafter, exemplary embodiments will be described in detail with reference to the accompanying drawings.

Figure 1A:
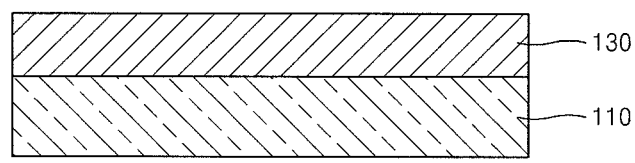
FIGS. 1A through 1D are schematic cross-sectional views for explaining a method of forming an organic thin film pattern, according to an embodiment.

FIGS. 1A through 1D are schematic cross-sectional views for explaining a method of forming an organic thin film pattern, according to an embodiment. Referring to FIG. 1A, the method of forming the organic thin film pattern comprises forming a first organic layer 130 on a substrate 110 on which a desired organic thin film pattern is to be formed.

The substrate 110 may comprise various materials, such as a glass substrate having $SiO_2$ as a main component, a plastic substrate, or a metal foil, for example.

A fluorine-based polymer film is formed on the substrate 110 by performing a deep coating method, a spin coating method, etc. on a fluorine-based polymer film. The fluorine-based polymer film may be any one of materials represented by Equation 1 through Equation 3 below. Further, the fluorine polymer film may be a functional material containing fluorine in an amount of from about 10 to about 50%.

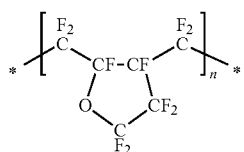

Equation 1

(where n is an integer between 50 and 1000)

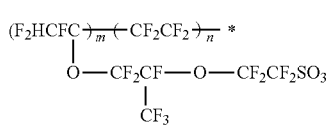

Equation 2

(where m is an integer between 50 and 1000, and n is a integer between 50 and 1000)

Equation 3

(where n is an integer between 50 and 1000)

If the fluorine-based polymer film is used by melting a fluorinated solvent having a low boiling point, it is possible to form a thin film having a uniform thickness between several tens of nanometers and several micrometers using the deep coating method, and it is useful for adjusting the thickness of a sacrifice layer that will be described later according to a thickness of the desired organic thin film pattern.

Figure 1B:
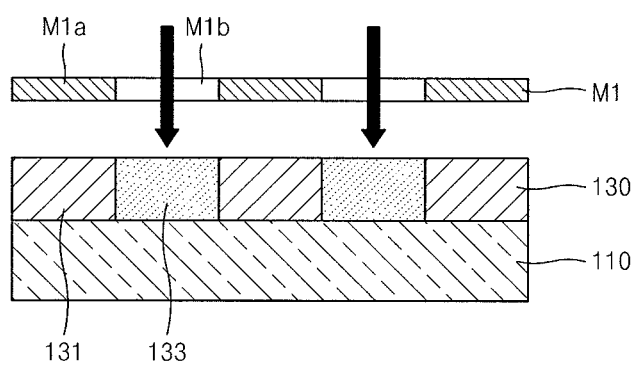

Referring to FIG. 1B, the fluorine-based polymer film 130 is selectively removed by selectively irradiating light energy on the fluorine-based polymer film that is the first organic layer 130, and a sacrifice layer pattern region 131 is formed using the remaining first organic layer 130.

In this regard, a laser may be used to irradiate light energy. For example, an excimer laser may be used to irradiate light energy. Further, a laser ablation process of selectively removing a first part 133 of the first organic layer 130 can be performed by irradiating a laser onto a first mask M1 that is disposed on the first organic layer 130 and has a predetermined pattern.

The laser that passes through a light transmission portion M1$b$ of the first mask M1 including a light blocking portion M1$a$ and the light transmission portion M1$b$ that are disposed on the first organic layer 130 is absorbed in the part first 133 of the first organic layer 130. The part first 133 of the first organic layer 130 that has absorbed the laser is ablated through thermal diffusion. A sacrifice layer pattern region 131 of the first organic layer 130 onto which the laser is not irradiated remains as the sacrifice layer pattern 131 that will be described later.

Although a mask having a desired predetermined pattern is used to selectively remove a part of the first organic layer 130, the present embodiments are not limited thereto. That is, although the mask is used to obtain a high resolution pattern, it is possible to directly irradiate the laser onto the first organic layer 130 without a mask.

Figure 1C:
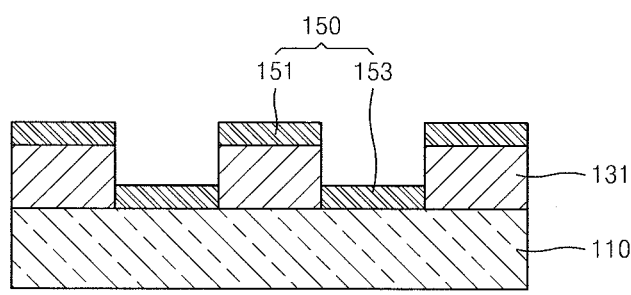

Referring to FIG. 1C, a second organic layer 150 is formed on the entire surface of the substrate 110 on which the sacrifice layer 131 is formed.

Although the second organic layer 150 may be formed using a deposition process, the present embodiments are not limited thereto and the second organic layer 150 may be formed using various methods of inkjet printing, screen printing, laser induced thermal imaging (LITI), etc. The second organic layer 150 includes a layer 153 formed on an upper portion of the substrate 110 on which the sacrifice layer 131 is not formed and a layer 151 formed on the upper portion of the sacrifice layer 131.

As described above, the second organic layer 150 may comprise various materials. For example, the second organic layer 150 may comprise an organic light emitting material, an organic color filter material, an organic semiconductor material, etc. This will be described in more detail later.

Figure 1D:
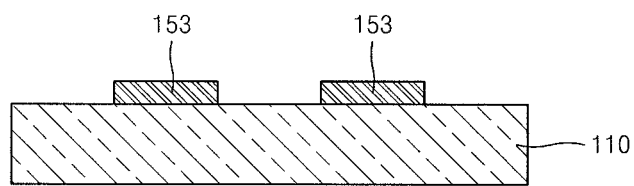

Referring to FIG. 1D, a desired pattern 153 of the second organic layer 150 is formed on the substrate 110 using a solvent (not shown).

If a fluorine-based polymer film is used as the first organic layer 130, a fluorine-based solvent may be used as the solvent. In the present embodiment, HFE-7100 (3M™ NOVEC, St. Paul, Minn.) is used as the fluorine-based solvent. Group 17 halogen elements such as fluorine are substantially unresponsive to materials other than halogen elements. Such a chemical property of the fluorine-based solvent does not deteriorate the second organic layer 150 on which a pattern is to be formed.

The sacrifice layer 131 is removed by using a fluorine-based solvent. The second organic layer 151 formed on the sacrifice layer 131 is lifted off. Thus, the desired part 153 of the second organic layer 151 remains as a pattern on the substrate 110.

Another embodiment of a method of forming an organic thin film pattern will now be described with reference to FIGS. 2A through 2D.

FIGS. 2A through 2D are schematic cross-sectional views for explaining a method of forming an organic semiconductor layer of an organic thin film transistor, according to another embodiment.

Figure 2A:
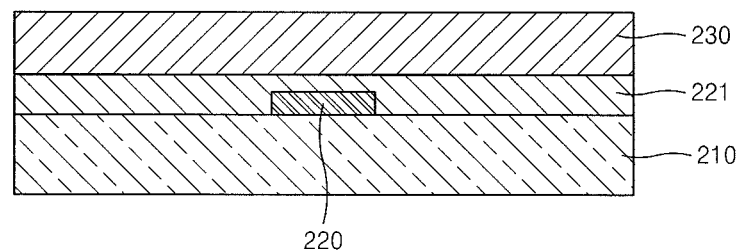
FIGS. 2A through 2D are schematic cross-sectional views for explaining a method of forming an organic semiconductor layer of an organic thin film transistor, according to another embodiment.

Referring to FIG. 2A, a first organic layer 230 is formed on a substrate 210 on which a gate electrode 220 and a gate insulation film layer 221 are formed.

The gate electrode 220 may be formed using a general photolithograph process. For example, a gate metal material is deposited onto the substrate 210, a photoresist (PR) is coated on the deposited substrate 210, and the PR is exposed to light through a photomask (not shown) on which a predetermined pattern is formed. The gate electrode 220 is formed using an etching process by soaking the exposed PR in a developing liquid, developing the soaked PR, and forming a desired PR pattern. The gate insulation film layer 221 is formed on the gate electrode 220. A fluorine-based polymer that is the first organic layer 230 is coated onto the gate insulation layer 221 to a predetermined thickness.

Figure 2B:
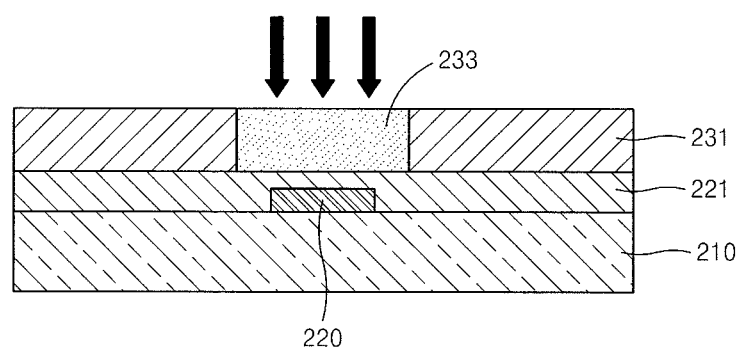

Referring to FIG. 2B, the fluorine-based polymer film 230 is selectively ablated by selectively irradiating light energy on the fluorine-based polymer film that is the first organic layer 230, and a sacrifice layer pattern 231 is formed using the remaining first organic layer 230. In this regard, as mentioned above, a laser may be used to irradiate light energy. An excimer laser may be used to irradiate light energy.

A pulse excimer laser is directly irradiated onto the first organic layer 230 and a part 233 of the first organic layer 230 is directly ablated without using a mask (not shown), and as described above, the part 233 of the first organic layer 230 can be selectively ablated by irradiating a laser onto a mask that is disposed on the first organic layer 230 and has a predetermined pattern.

Figure 2C:
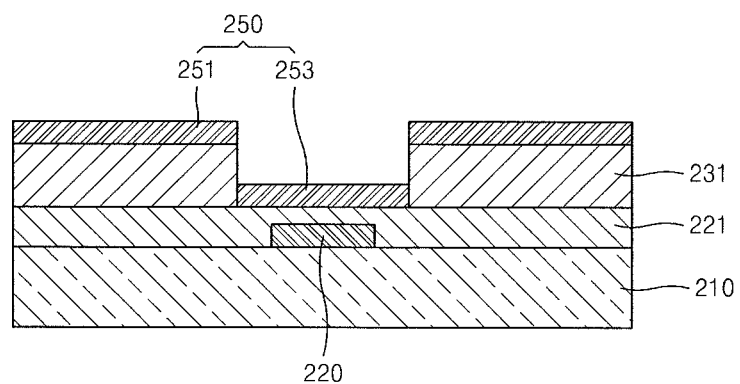

Referring to FIG. 2C, the second organic layer 250 is formed on the entire surface of the gate insulation layer 221 on which the sacrifice layer 231 is formed.

The second organic layer 250 is formed of an organic semiconductor material. When the second organic layer 250 is formed of a polymer organic material, the organic semiconductor material may include polythiophene and derivatives thereof, poly-p-phenylenevinylene and derivatives thereof, poly-paraphenylene and derivatives thereof, polyprolene and derivatives thereof, polyphenylenevinylene and derivatives thereof, and polythiophene-hetero ring aromatic copolymer and derivatives thereof. When the second organic layer 250 is formed of a low-molecular organic material, the organic semiconductor material may include pentacene, tetracene, oligoacene of naphthalene and derivatives thereof, alpha-6-thiophene, oligothiophene of alpha-5-thiophene and derivatives thereof, metal-free or metal containing phthalocyanine and derivatives thereof, pyromellitic dianhydride or pyromellitic diimide and derivatives thereof, perylene tetra carboxylic acid dianhydride or perylene-tetra-carboxylic diimide and derivatives thereof. In addition, the second organic layer 250 may comprise various organic semiconductor materials.

The second organic layer 250 includes a layer 253 formed on an upper portion of the gate insulation layer 221 on which the sacrifice layer 231 is not formed and a layer 251 formed on the upper portion of the sacrifice layer 231.

Figure 2D:
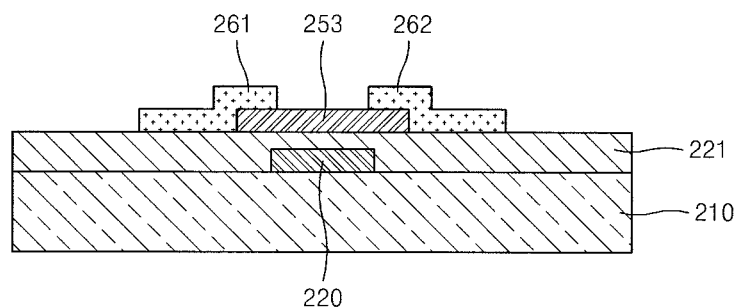

Referring to FIG. 2D, the second organic layer 251 formed on the sacrifice layer 231 is removed by removing the sacrifice layer 231 using a fluorine-based solvent (not shown). Thus, the desired organic semiconductor layer 253 remains as a pattern on the gate insulation layer 221. In this regard, as described above, the organic semiconductor layer 253, which is chemically very sensitive, is stably patterned using the fluorine-based solvent that is substantially unresponsive. A source electrode 261 and a drain electrode 262 are formed on both sides of the organic semiconductor layer 253 and an organic thin film transistor (OTFT) that is a type of organic semiconductor device is formed.

Photolithography technology that is generally used to manufacture an inorganic semiconductor device is not widely used to manufacture an organic semiconductor device, despite technologies and equipments in which possibilities of a high resolution and a large area process are well established. This is due to a chemical compatibility between a solvent and organic substances used in photolithography technology. An organic substance can be damaged or may deteriorate due to a solvent used to coat or develop a photoresist (PR) during an organic semiconductor device manufacturing process.

However, according to the method of forming the organic thin film pattern of the organic semiconductor device of the present embodiment, the organic thin film does not deteriorate due to the chemical characteristics of a fluorine-based solvent used to form the organic thin film pattern. Further, an additional chemical development process is unnecessary and thus a manufacturing process is very simple. It is possible to form a high resolution organic thin film pattern by using an optical method of removing a sacrifice layer and forming a pattern using laser ablation.

Although a typical bottom gate thin film transistor in which the gate electrode 220 is disposed under the organic semiconductor layer 253, and the source and drain electrodes 261 and 262 are formed on the organic semiconductor layer 253 is described in the present embodiment, this is just exemplary and various structures of organic thin film transistors may be applied.

Although the organic semiconductor layer of a thin film transistor is formed using the second organic layer formed of an organic semiconductor material in the present embodiment, the present embodiments are not limited thereto. For example, the second organic layer may be used to form an organic light emitting device in which organic light emitting materials of different colors capable of emitting a white light are stacked between an anode and a cathode. For example, a sacrifice layer can be formed using a fluorine-based polymer film as a first organic layer on a substrate on which an anode (or a cathode) is formed, the organic light emitting layers of different colors having red, blue, and green colors are sequentially stacked on the entire surface of the sacrifice layer, the sacrifice layer and the organic light emitting layers of different colors formed on the sacrifice layer are removed using a fluorine-based solvent, and the cathode (or the anode) is formed thereon, thereby manufacturing the organic light emitting device capable of emitting the white light.

Another embodiment of a method of forming an organic thin film pattern will now be described with reference to FIGS. 3A through 3D.

FIGS. 3A through 3D are schematic cross-sectional views for explaining subsequent processes of forming the unit organic thin film pattern of FIGS. 1A through 1D, according to an embodiment.

Figure 3A:
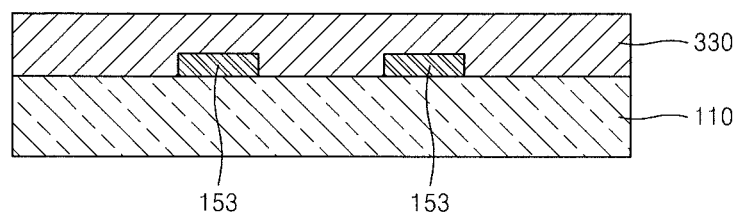
FIGS. 3A through 3D are schematic cross-sectional views for explaining subsequent processes of forming a unit organic thin film pattern of FIGS. 1A through 1D, according to an embodiment.

Referring to FIG. 3A, a fluorine-based polymer film 330 is coated again on the substrate 110 on which the second organic layer pattern 153 is formed during the first unit organic thin film pattern forming process described with reference to FIGS. 1A through 1D.

Figure 3B:
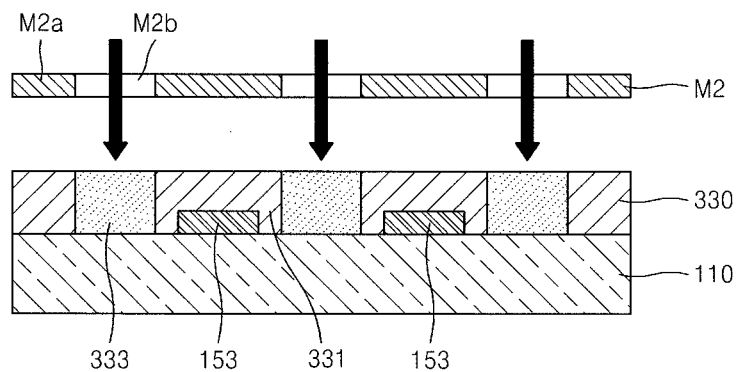

Referring to FIG. 3B, the fluorine-based polymer film 330 is selectively ablated by selectively irradiating light energy onto the fluorine-based polymer film 330, and the remaining fluorine-based polymer film 330 is formed as a second sacrifice layer pattern 331. In this regard, the second sacrifice layer pattern 331 is formed on the second organic layer pattern 153 that has been formed during the first unit organic thin film pattern forming process.

When a second mask M2 is used to form the second sacrifice layer pattern 331, a light blocking unit M2a is formed on a region on which the second organic layer pattern 153 is formed, and a light transmission unit M2b is formed on a region on which the second organic layer pattern 153 is not formed. By irradiating a laser onto the second mask M2, a fluorine-based polymer film 333 of the region on which the second organic layer pattern 153 is not formed is selectively ablated, and a part of the fluorine-based polymer film 333 of the region on which the second organic layer pattern 153 is formed remains as the second sacrifice layer pattern 331.

Figure 3C:
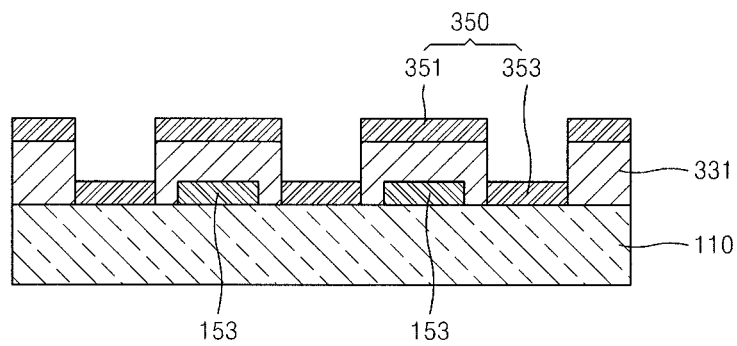

Referring to FIG. 3C, a third organic layer 350 is formed on the entire surface of the substrate 110 on which the second sacrifice layer 331 is formed. The third organic layer 350 may be formed using a deposition process, and includes a layer 353 formed on the upper portion of the substrate 110 on which the second sacrifice layer 331 is not formed, and a layer 351 formed on the upper portion of the second sacrifice layer 331.

As described above, the third organic layer 350 may comprise various materials. For example, the third organic layer 350 may comprise an organic light emitting material, an organic color filter material, and an organic semiconductor material. This will be described in more detail later.

Figure 3D:
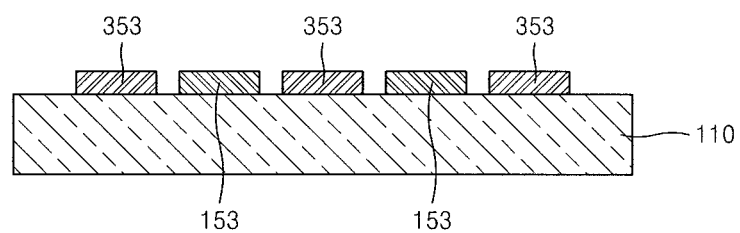

Referring to FIG. 3D, a desired pattern 353 of the third organic layer 350 is formed on the substrate 110 using a fluorine-based solvent (not shown).

The third organic layer pattern 351 formed on the second sacrifice layer 331 is removed by removing the second sacrifice layer 331 using the fluorine-based solvent. Thus, the second organic layer pattern 153 formed during the first unit organic thin film pattern process and the third organic thin film pattern 353 formed during a present organic thin film pattern forming process (hereinafter, referred to as "a second unit organic thin film pattern forming process") remain on the substrate 110.

Therefore, the second organic layer pattern 153 and the third organic layer pattern 353 that are different from each other may be formed on the substrate 110 while not deteriorating the second organic layer pattern 153 and the third organic layer pattern 353 due to the chemical property of the fluorine-based solvent.

Hereinafter, an example of using the second organic layer pattern 153 and the third organic layer pattern 353 as organic layers of an organic light emitting device, will be described.

The organic light emitting device combines electrons injected into a cathode and holes injected into an anode in an organic layer disposed between the anode and the cathode, excites light emitting molecules of a light emitting layer through the combination of electrons and holes, which then return to a base state, and emits discharged energy as light. This is a unit device for realizing an organic light emitting display device. Although not shown, the second organic layer pattern 153 and the third organic layer pattern 353 are formed on the anode (or the cathode).

When the organic layer is a low-molecular weight organic substance, the organic layer generally has a multi-layer structure. In the multi-layer structure, at least one, including an emitting layer (EL), of a hole injection layer (HIL), a hole transport layer (HTL), the EL, an electron transport layer (ETL), an electron injection layer (EIL), etc. may be stacked. The organic layer may comprise various organic materials, for example, copper phthalocyanine (CuPc), N, N'-di(naphthalene-1-yl)-N, N'-diphenyl-benzidine (NPB), tris(8-hydroxyquinoline) aluminum (Alq3), or the like. When the organic layer is a polymer organic substance, the HTL may be further included in a direction of the anode from an organic light emitting layer. The polymer HTL may comprise polyethylenedioxythiophene (PEDOT) or polyaniline (PANI). The polymer organic light-emitting layer may comprise a poly (phenylene vinylene) (PPV), soluble PPV's, Cyano-PPV, polyfluorene, etc.

One method of forming the organic light emitting display device involves a vacuum process using a shadow mask having a pattern of an organic light emitting layer as a fixed fine pattern. However, there are many problems in manufacturing a large-sized display device due to limitations of the vacuum process and resolution of the shadow mask.

Further, a photolithography technology that is generally used to manufacture an inorganic semiconductor device is not applicable to manufacturing of an organic semiconductor device, despite technologies and equipment in which possibilities of a high resolution and a large area process are well established, since an organic substance can be damaged or deteriorates due to a solvent used to coat or develop a PR during an organic semiconductor device manufacturing process.

Further, to solve the above problems, although (Laser Induced Thermal Imaging) LITI technology of transferring a previously formed organic thin film onto a substrate by using a laser has been developed, since the laser is directly irradiated onto the organic thin film, the material characteristics of the organic thin film or operating characteristics of a device may be adversely affected.

However, according to the method of forming the organic thin film pattern of the organic light emitting device of the present embodiment, high resolution pattern arrays can be uniformly applied to a wide area compared to the conventional shadow mask technology, and pattern arrays of different organic light emitting materials can be continuously formed by simply repeating a unit process, which is favorable to process simplification and low pricing of the high resolution organic light emitting display.

The organic thin film does not deteriorate due to the chemical property of a fluorine-based solvent used to form the organic thin film pattern, and an additional chemical developing process is not necessary, thus making a manufacturing process simple.

It is possible to form a high resolution organic thin film pattern by using an optical method of ablating a sacrifice layer and forming a pattern by using laser ablation.

Figure 4:
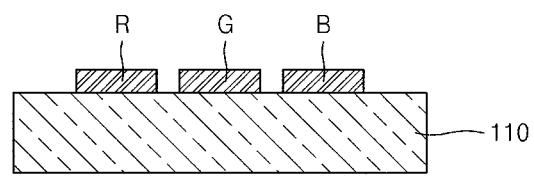
FIG. 4 illustrates an organic light emitting device including an organic light emitting layer (R, G, and B) of different colors on a substrate, according to an embodiment.

Although two unit organic thin film pattern forming processes are performed to form two different organic thin film patterns, such as a second organic layer pattern and a third organic layer pattern in the present embodiment, the present embodiments are not limited thereto. Three or more unit processes can be repeatedly performed. For example, three organic thin film pattern forming processes are performed to manufacture an organic light emitting device including an organic light emitting layer (R, G, and B) of different colors on the substrate as shown in FIG. 4.

Further, the method of forming the organic thin film pattern of the present embodiment can be applied to form a pattern of an organic color filter. Three organic thin film pattern forming processes are continuously and repeatedly performed to manufacture an organic light emitting device including an organic color filter layer (R, G, and B) of different colors.

Figure 5:
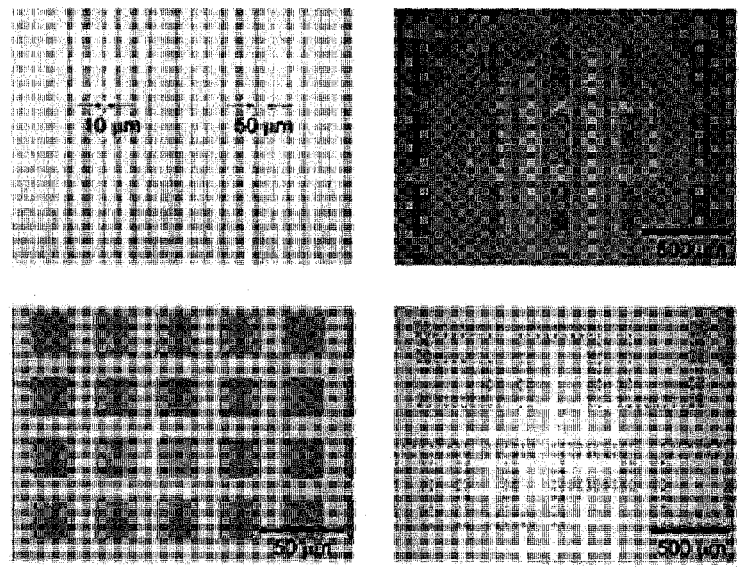
FIG. 5 illustrates photos of fine pattern arrays of various organic materials manufactured during a unit organic thin film pattern forming process observed by using an optical microscope, according to an embodiment.

FIG. 5 illustrates photos of fine pattern arrays of various organic materials manufactured during a unit organic thin film pattern forming process observed by using an optical microscope, according to an embodiment.

Referring to FIG. 5, a linear pattern having a minimum width of about 10 micrometers can be formed. A process resolution can be reduced to several micrometers in terms of an optical method such as laser ablation. Further, rectangular pattern arrays of about 100 micrometers in width and about 300 micrometers in height that is similar to a size of a real display pixel are uniformly formed on a wide area. The organic thin film patterns can be formed using Alq3, can be formed using other types of organic substances, and can be used using a general pattern process with respect to any organic substance.

Figure 6:
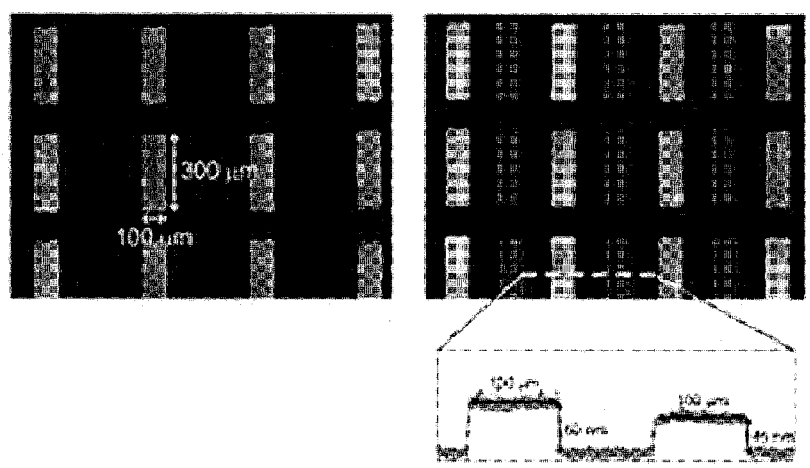
FIG. 6 illustrates photos of pixel arrays of organic light emitting materials having different light emitting wavelengths manufactured by continuously performing a unit organic thin film pattern forming process and observed by using a fluorescence microscope, according to an embodiment.

FIG. 6 illustrates photos of pixel arrays of organic light emitting materials having different light emitting wavelengths manufactured by continuously performing a unit organic thin film pattern forming process and observed by using a fluorescence microscope, according to an embodiment.

Referring to FIG. 6, fine pixel pattern arrays of 100 μm×300 μm of organic light emitting materials are continuously formed. In a left photo, a green organic thin film pattern is formed during a first unit process. In a right photo, a blue organic thin film pattern is formed between green organic thin film patterns during a second unit process.

A lower right figure shows a cross-sectional structure of the organic thin film patterns. The organic thin film patterns have uniform widths, and may have different thicknesses.

Figure 7:
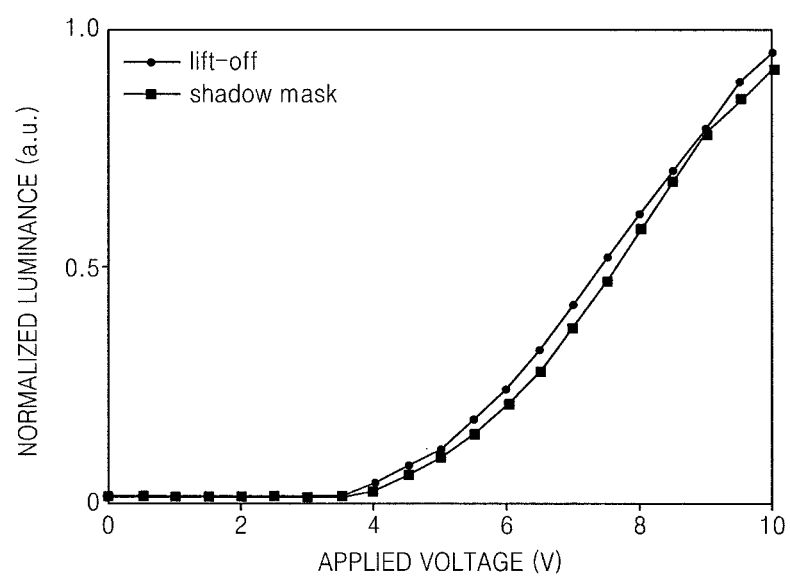
FIG. 7 is a graph of a comparison of the light emitting characteristics between an organic light emitting device manufactured using the method of the present embodiments and an organic light emitting device manufactured using the conventional shadow mask technology.

FIG. 7 is a graph of a comparison of the light emitting characteristics between an organic light emitting device manufactured using the method of the present embodiments and an organic light emitting device manufactured using the conventional shadow mask technology.

Referring to FIG. 7, the comparison of light emitting characteristics between the two organic light emitting devices does not show a significant difference. As described above, the method of the present embodiments can form a high resolution fine pattern and does not deteriorate device performance compared to the conventional method.

The method of manufacturing a high resolution organic thin film pattern of the present embodiment exhibits, for example, the following effects.

The organic thin film pattern does not deteriorate due to the chemical property of a fluorine-based solution used to form the organic thin film pattern.

A chemical developing process is not additionally necessary, and thus a manufacturing process is simplified.

An optical laser ablation method is used to lift off a sacrifice layer and form a pattern, thereby forming the high resolution organic thin film pattern.

When an organic light emitting layer of an organic light emitting display device is formed, a high resolution pattern array is equally applied to a large area compared to the conventional shadow mask technology, which is favorable to process simplification and low cost of the high resolution organic thin film pattern.

The claims of the present embodiments will be described in terms of an indispensable processing and a usable material, and it will be understood by one of ordinary skill in the art that the concept and specific embodiments can be used as methods of achieving an objective similar to the present embodiments. The elements shown in the drawings may be exaggerated or reduced for the convenience of description and thus the present embodiments are not limited by the sizes or shapes thereof. It will be understood by one of ordinary skill in the art that various changes in form and details may be made therein without departing from the spirit and scope of the present embodiments as defined by the following claims.

What is claimed is:

1. A method of forming an organic thin film pattern, the method comprising:
   forming a first organic layer comprising a fluorine-based polymer on a substrate;
   removing a part of the first organic layer by irradiating light energy onto the first organic layer, and forming a remaining part of the first organic layer as a sacrifice layer;
   forming a second organic layer on the substrate and the entire surface of the sacrifice layer; and
   lifting off the second organic layer formed on the sacrifice layer by removing the sacrifice layer using a water-free fluorine-based solvent, and forming the remaining second organic layer as a second organic layer pattern.

2. The method of claim 1, wherein, in the removing of the first organic layer, a laser ablation method is used to irradiate a laser on a mask having a predetermined pattern disposed on the first organic layer.

3. The method of claim 2, wherein, in the removing of the first organic layer, an excimer laser is irradiated.

4. The method of claim 1, wherein, in the forming of the second organic layer, the second organic layer is formed of an organic light emitting material of an organic light emitting device (OLED) containing an organic light emitting material disposed on the substrate between a first electrode and a second electrode.

5. The method of claim 4, wherein a plurality of layers of the organic light emitting material of different colors are formed so as to emit a white light.

6. The method of claim 1, wherein, in the forming of the second organic layer, the organic layer is an active layer of an organic thin film transistor.

7. The method of claim 1, wherein, in the forming of the second organic layer, the second organic layer is formed of an organic color filter material.

8. The method of claim 1, wherein, in the forming of the second organic layer, the second organic layer is formed using a deposition method.

9. A method of forming an organic thin film pattern, the method comprising:
   (a) forming a first organic layer comprising a fluorine-based polymer on a substrate;
   (b) removing a part of the first organic layer by irradiating light energy onto the first organic layer, and forming a sacrifice layer from the remaining part of the first organic layer;
   (c) forming a second organic layer on the substrate and the entire surface of the sacrifice layer;
   (d) lifting off the second organic layer formed on the sacrifice layer by removing the sacrifice layer using a water-free fluorine-based solvent, and forming a second organic layer pattern from the remaining second organic layer; and
   (e) repeatedly performing the steps of (a) through (d) on the substrate on which the second organic layer pattern is formed, and forming another second organic layer pattern on a region of the substrate on which the second organic layer pattern is not formed.

10. The method of claim 9, wherein, in the removing of the first organic layer, a laser ablation method is used to irradiate a laser on a mask having a predetermined pattern disposed on the first organic layer.

11. The method of claim 10, wherein, in the removing of the first organic layer, an excimer laser is irradiated.

12. The method of claim 9, wherein, in the forming of the second organic layer, the second organic layer is formed of an organic light emitting material of an OLED containing an organic light emitting material disposed on the substrate between a first electrode and a second electrode.

13. The method of claim 12, wherein the organic light emitting material is formed of a low-molecular weight material.

14. The method of claim 12, wherein the organic light emitting material formed during the forming of the second organic layer has a different color from the organic light emitting material formed during continuous performing of the unit process.

15. The method of claim 14, wherein the organic light emitting material formed during the forming of the second organic layer and the organic light emitting material formed during repeated performing of steps (a) through (d) realize full colors.

16. The method of claim 9, wherein, in the forming of the second organic layer, the second organic layer is formed of a color filter material.

17. The method of claim 16, wherein the color filter material formed during the forming of the second organic layer has a different color from the color filter materials formed during repeated performing of steps (a) through (d).

18. The method of claim 17, wherein the color filter material formed during the forming of the second organic layer and the color filter material formed during repeated performing of steps (a) through (d) realize full colors.

19. The method of claim 9, wherein, in the forming of the second organic layer, the second organic layer is formed using a deposition method.

20. The method of claim 9, wherein step (e) is repeatedly performed a predetermined number of times.

* * * * *